United States Patent
Taniguchi et al.

(10) Patent No.: US 6,401,653 B1
(45) Date of Patent: Jun. 11, 2002

(54) MICROWAVE PLASMA GENERATOR

(75) Inventors: Michio Taniguchi, Hyogo; Shoichiro Minomo, Osaka; Shigeki Amadatsu, Hyogo; Kazuki Kondo, Wakayama, all of (JP)

(73) Assignee: Daihen Corporation, Osaka (JP)

( * ) Notice: Subject to any disclaimer, the term of this patent is extended or adjusted under 35 U.S.C. 154(b) by 0 days.

(21) Appl. No.: 09/829,191

(22) Filed: Apr. 9, 2001

(30) Foreign Application Priority Data

Apr. 18, 2000 (JP) .......................... 2000-116641
Apr. 18, 2000 (JP) .......................... 2000-116642

(51) Int. Cl.$^7$ .............................................. C23C 16/00

(52) U.S. Cl. ...................... 118/723 MW; 118/723 ME; 118/723 MR; 315/111.21; 156/345.41

(58) Field of Search ................................ 118/723 MW, 118/723 ME, 723 MR, 723 MA; 156/345; 313/231.31; 315/111.21; 333/239; C23F 4/00

(56) References Cited

U.S. PATENT DOCUMENTS

| | | | | |
|---|---|---|---|---|
| 5,063,329 A | * | 11/1991 | Okamoto | 315/111.21 |
| 5,360,485 A | * | 11/1994 | Bou et al. | 118/723 ME |
| 5,389,153 A | * | 2/1995 | Paranjpe et al. | 118/723 ME |
| 5,611,864 A | * | 3/1997 | Kimura et al. | 118/723 MR |
| 5,625,259 A | * | 4/1997 | Holber et al. | 315/111.21 |
| 5,895,548 A | * | 4/1999 | Ettinger et al. | 156/345 |

FOREIGN PATENT DOCUMENTS

JP 07029889 A 1/1995

* cited by examiner

Primary Examiner—Gregory Mills
Assistant Examiner—Anna Michelle Crowell
(74) Attorney, Agent, or Firm—Jordan and Hamburg LLP

(57) ABSTRACT

A plasma generator according to the invention includes a rectangular waveguide into which a microwave is introduced, a coaxial tube connected in a T shape to the rectangular waveguide through their respective openings, a vacuum sealing window for blocking the openings with an insulator to thereby vacuum seal the interior of the coaxial tube against the rectangular waveguide, and an insulator arranged in the coaxial tube as linked to the vacuum sealing window, thus facilitating microwave matching.

8 Claims, 10 Drawing Sheets

Gas pressure dependency of load side reflection coefficient and phase (conicalness L = 105 mm)

MICROWAVE PLASMA GENERATOR

BACKGROUND OF THE INVENTION

1. Field of the Invention

The invention relates to a plasma generator for generating plasma by means of microwave discharge. This plasma generator is well suited for use in, for instance, processes of etching and ashing on a semiconductor wafer placed in a processing chamber in which a plasma gas is introduced or of cleaning of the chamber.

2. Description of the Related Art

This prior art plasma generator is described below with reference to FIG. 10. In FIG. 10, a reference numeral 100 represents a rectangular-sectional waveguide, at an opening of one end side of which is mounted a microwave power source (not shown) for introducing a microwave to the interior of this rectangular waveguide.

Reference numerals 102 and 104 represent cylindrical conductors connected vertically in a tube-axial direction to the walls of the respective open tubes of the rectangular waveguide 100, one cylindrical conductor 102 of which has a gas inlet 102a for introducing plasma and the other cylindrical conductor 104 of which has its opening 104a connected to the processing chamber now shown.

A reference numeral 106 represents a cylindrical insulator, which is inserted through the rectangular waveguide 100 vertically in its tube-axial direction and mounted in both of the cylindrical conductors 102 and 104 and also which has its portion positioned in the rectangular waveguide 100 serving as a plasma generating portion 106a.

A reference numeral 108 represents a movable terminal which can move in the tube-axial direction so that the plasma generating portion 106a of the cylindrical insulator 106 may have a stronger microwave field therein.

In such a plasma generator, when a microwave is introduced into the rectangular waveguide 100 and a plasma gas is introduced through the gas inlet 102a in the cylindrical conductor 102, plasma is generated due to microwave discharge in the internal space of the plasma generating portion 106a of the cylindrical insulator 106.

The plasma thus generated in the cylindrical insulator 106 is introduced to, for example, a semiconductor wafer positioned in a processing chamber connected to the opening 104a so that this wafer may be etched or ashed or that the chamber may be cleaned.

In the prior art plasma generator, however, since a microwave inside the rectangular waveguide 100 travels perpendicular to the surface of the plasma generating portion 106a of the cylindrical insulator 106, its field acts parallel with the plasma. Accordingly, the microwave has a strong reflected wave power.

To guard against this, conventionally, a matching device is typically attached to the rectangular waveguide 100 to utilize its matching action for suppressing the reflected wave power of the microwave (microwave matching), which is, however, not always easy and is time consuming.

The matching is thus difficult and time consuming, thus leading to problems of inefficiencies of, for example, semiconductor wafer processes, in short, various operations utilizing plasma.

In addition, a large and heavy body of the matching device itself makes it inconvenient to handle it and its high price also increases the costs of the apparatus as a whole.

Also, the prior art plasma generator has poor radiation of the heat generated along with the generation of plasma, thus leading to disabled supply of a high microwave power problematically.

That is, since plasma occurs at a portion (plasma generating portion 106a) of the cylindrical insulator 106 that portion is positioned in the rectangular waveguide 100, the heat due to plasma is generated locally. Moreover, thus locally generated heat is construction-wise difficult to radiate to the outside, so that if plasma is generated by supplying a high microwave power, the cylindrical insulator 106 is highly heated locally and may be damaged. For this reason, the prior art has been impossible to supply a high microwave power.

In order to inhibit the cylindrical insulator 106 from being highly heated locally, a cooling fan may possibly be provided for cooling the plasma generating portion 106a, in which case, however, a required large capacity of the cooling fan would enlarge the apparatus as a whole. Further, such a cooling fan, if used in a clean room for manufacturing of semiconductor devices in which the plasma generator is mounted, may disturb the surrounding atmosphere problematically.

Also, although the cylindrical insulator 106 may possibly be of a double-tube construction so that a cooling medium may be distributed therethrough to radiate the heat, the cylindrical insulator 106 is generally made of a relatively brittle glass tube and also exposed to hot plasma and have the atmospheric pressure applied thereon from the outside because of its internal vacuum state, thus being subject to damages due to heat and pressure. For this reason, the cylindrical insulator 106 must be designed in case of damages, in which case in turn the cooling medium may come into the apparatus to thereby spread its leakage throughout the apparatus, so that such a heat radiating construction could not have been employed.

SUMMARY OF THE INVENTION

In view of the above, it is an object of the invention to facilitate microwave matching.

Another object of the invention is to facilitate microwave matching without utilizing a matching device to thereby eliminate the necessity of using it, thus making it easy to handle the apparatus as a whole, and also to reduce the costs of the apparatus.

A further another object of the invention is to cool the apparatus reliably with a simple construction.

The other objects, features, and advantages of the invention will become clear from the following description.

A plasma generator according to the invention comprises, as shown in FIG. 1, a rectangular waveguide (2) in which a microwave is introduced, a coaxial tube (4) connected in a T shape to the rectangular waveguide (2) through their respective openings (2b and 42c), a vacuum-sealing window (6) for blocking the openings (2b and 42c) with an insulating material to thereby vacuum-seal the interior of the coaxial tube (4) against the rectangular waveguide (2), and an insulator (16) arranged in the coaxial tube (4) as linked to the vacuum-sealing window (6).

According to the invention, the insulator (16) is provided at a boundary between plasma and a microwave so that the electric field of the microwave may not run parallel with the plasma. Accordingly, the microwave can be absorbed by the plasma more easily to thereby reduce its reflected wave power. Moreover, by adjusting the shape of the insulator (16), the impedance of the total load can be kept roughly constant against large fluctuations in plasma impedance caused by transitional ignition of the plasma, changes in its process, etc., thus eliminating the conventional necessity of difficult microwave matching by use of a matching device in the rectangular waveguide (2), thus making more easy and efficient a variety of operations with plasma. In addition, it is possible to make it more easy and convenient to use the apparatus even with a large and heavy matching device and also reduce the costs of the apparatus.

Preferably the invention has such a double-tube construction that the above-mentioned coaxial tube (4) may consist of an inner conductor (41) and an outer conductor (42) disposed external of the inner conductor (41) radially with a predetermined gap therebetween and also such an annular construction that the above-mentioned insulator (16) may be mounted on the outer periphery of the above-mentioned inner conductor (41).

By this construction as a whole, a microwave power can be efficiently supplied from the insulator toward a plasma generating space (19) of the radially opposing gap between the inner conductor (41) and the outer conductor (42), thus increasing the plasma generation efficiency in that space preferably.

In this case, the above-mentioned inner conductor (41) may be of a solid construction or a hollow construction.

Also, preferably the invention has such a shape that the insulator (16) may shrink in area of its outer diameter surface as it goes on in a direction opposite to the side of the vacuum-sealing window (6).

In such a case, even when the pressure of a gas supplied to the plasma generating space (19) is changed according to a variety of processes of manufacturing a semiconductor device, it is possible to maintain the reflection coefficient of the microwave at a roughly constant value over a wide variation range of that pressure. Accordingly, preferably it is possible to conduct optimal setting accurately and easily over the variety of processes.

In this case, the above-mentioned diameter shape shrinkage includes not only the above-mentioned directional uniform diameter shrinkage but also partial diameter shrinkage and outer-diameter surface shrinkage for the insulator (16).

The plasma generator according to the invention comprises, as shown in FIG. 2, the rectangular waveguide (2) into which a microwave is introduced, a coaxial tube (4) communicatively connected in a T shape to the opening (2b) made in the rectangular waveguide (2), and a sealing means. The coaxial tube (4) comprises the inner conductor (41) which penetrates through the rectangular waveguide (2) at the opening (2b) in a tube-axial direction of the coaxial tube (4) in such a manner that its one end may protrude from the rectangular waveguide (2) and the outer conductor (42) which is disposed roughly in a coaxial manner with the inner conductor (41) outside the one end of the inner conductor (41). The sealing means blocks at the opening (2b) the gap between the rectangular waveguide (2) and the coaxial tube (4) with the vacuum-sealing window (6) and also vacuum-seals the plasma generating space (19) formed between the outer conductor (42) and the inner conductor (41) against the rectangular waveguide (2). Also, the other end of the inner conductor (41) is coupled to the rectangular waveguide (2) both thermally and electrically.

According to the invention, no plasma is generated inside the rectangular waveguide (2), with the plasma generating space (19) being formed inside the coaxial tube (4) connected in communication to the rectangular waveguide (2). Accordingly, heat generated in the plasma generating space (19) is radiated from the inner conductor (41) through the rectangular waveguide (2) thermally coupled to the other end of this inner conductor (41) to the outside and so is not accumulated in the inner conductor (41), thus avoiding damaging the inner conductor (41). Therefore, it is possible to supply a high microwave power without taking into account the effect of accumulation of heat in the apparatus.

According to the invention, preferably the inner conductor (41) comprises a barrel which has its one end blocked and also which has a cooling medium distribution path formed in its internal space.

In such a construction, heat generated by the plasma generating space (19) can be externally radiated even more rapidly by a cooling medium distributed through the cooling medium distribution path.

Also, according to the invention, preferably the inner conductor (41) houses a barrel (18) disposed therein for supplying a cooling medium, from the interior of which barrel is formed the cooling medium distribution path over the gap between this barrel (18) and the inner conductor (41).

This construction enables effective distribution of the cooling medium, thus making it possible to external radiate the heat generated in the plasma generating space (19) even more rapidly.

Also, according to the invention, preferably an insulator (not shown in FIG. 2) is provided for covering the outside of one end of the inner conductor (41).

In such a construction, the inner conductor (41) is not directly exposed to plasma, thus preventing a contamination (metal reaction product) from being diffused into plasma from the inner conductor (41).

Further, according to the invention, preferably the insulator (16) is cooled by the cooling medium distributed through the cooling medium distribution path.

This arrangement prevents a damage (crack and the like) from occurring on the insulator (16) which damage is caused by thermal stress generated along with plasma.

BRIEF DESCRIPTION OF THE DRAWINGS

These and other objects as well as advantages of the invention will become clear by the following description of preferred embodiments of the invention with reference to the accompanying drawings, wherein.

In all these figures, like components are indicated by the same numerals.

DETAILED DESCRIPTION OF THE INVENTION

The following will describe embodiments of the invention with respect to the drawings.

(First Preferred Embodiment)

Figure 1:
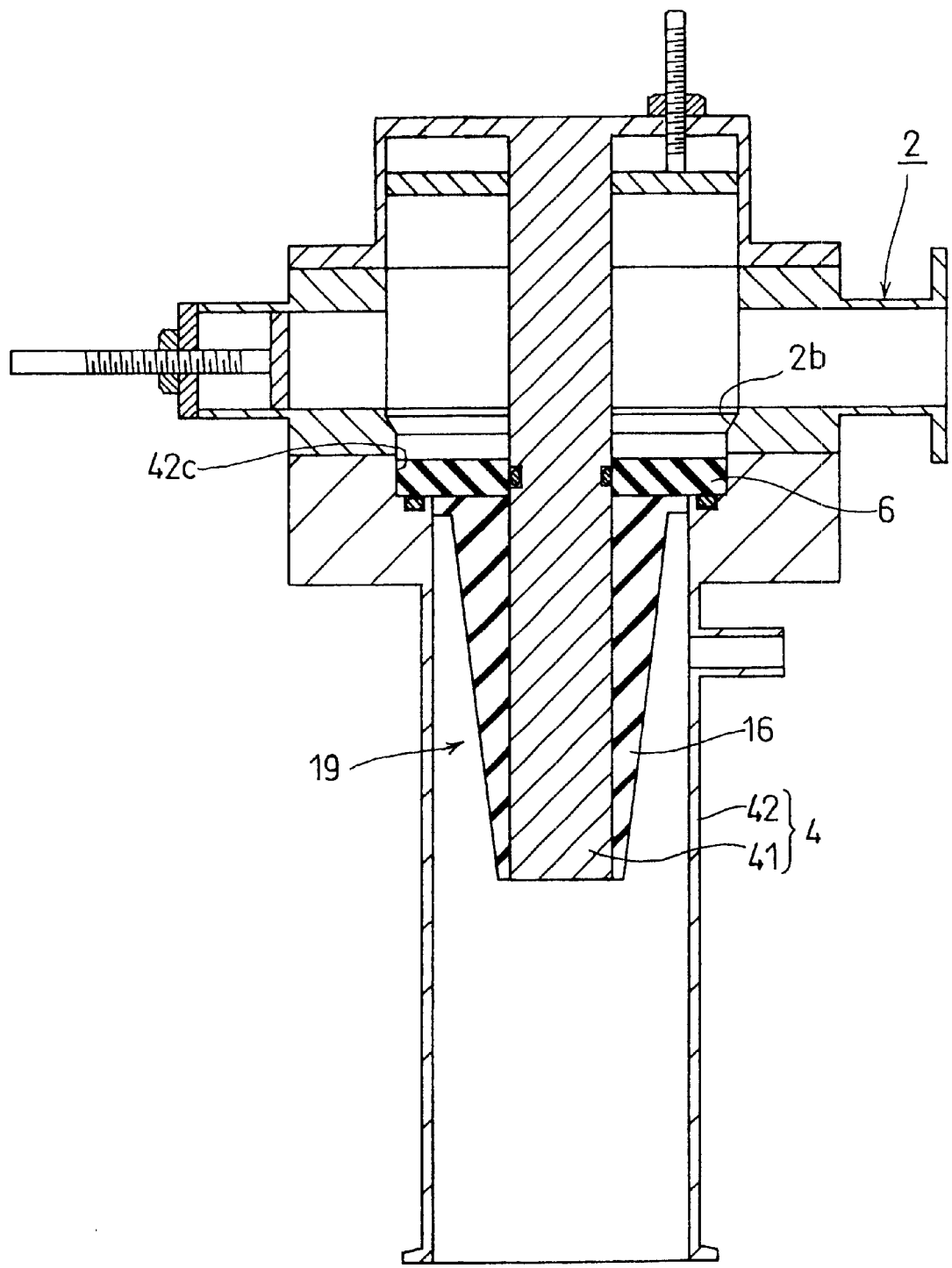
FIG. 1 is a vertical sectional side view of a plasma generator for explaining an important aspect of the invention.
Figure 2:
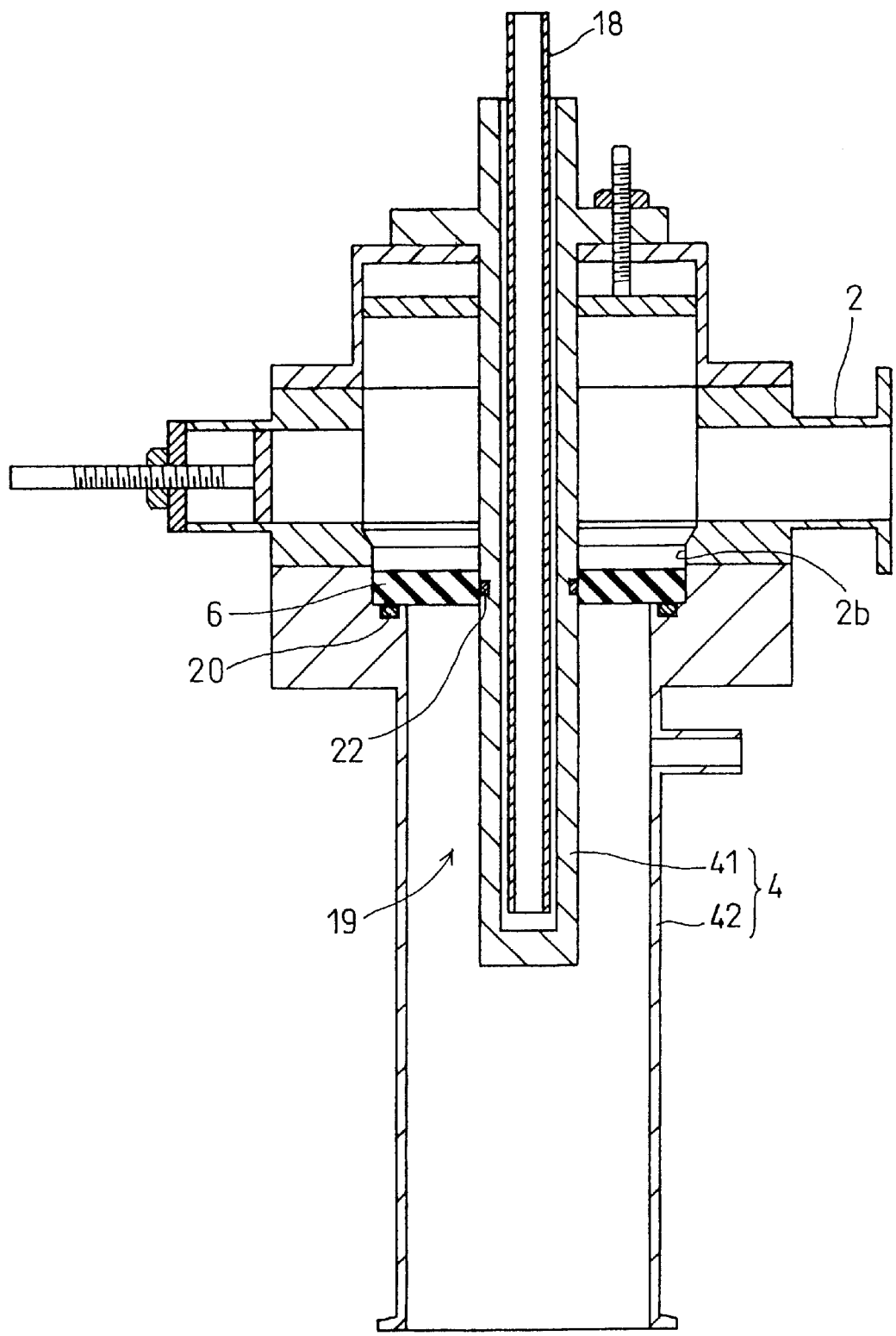
FIG. 2 is another vertical sectional side view of the plasma generator for explaining another important aspect of the invention.
Figure 3:
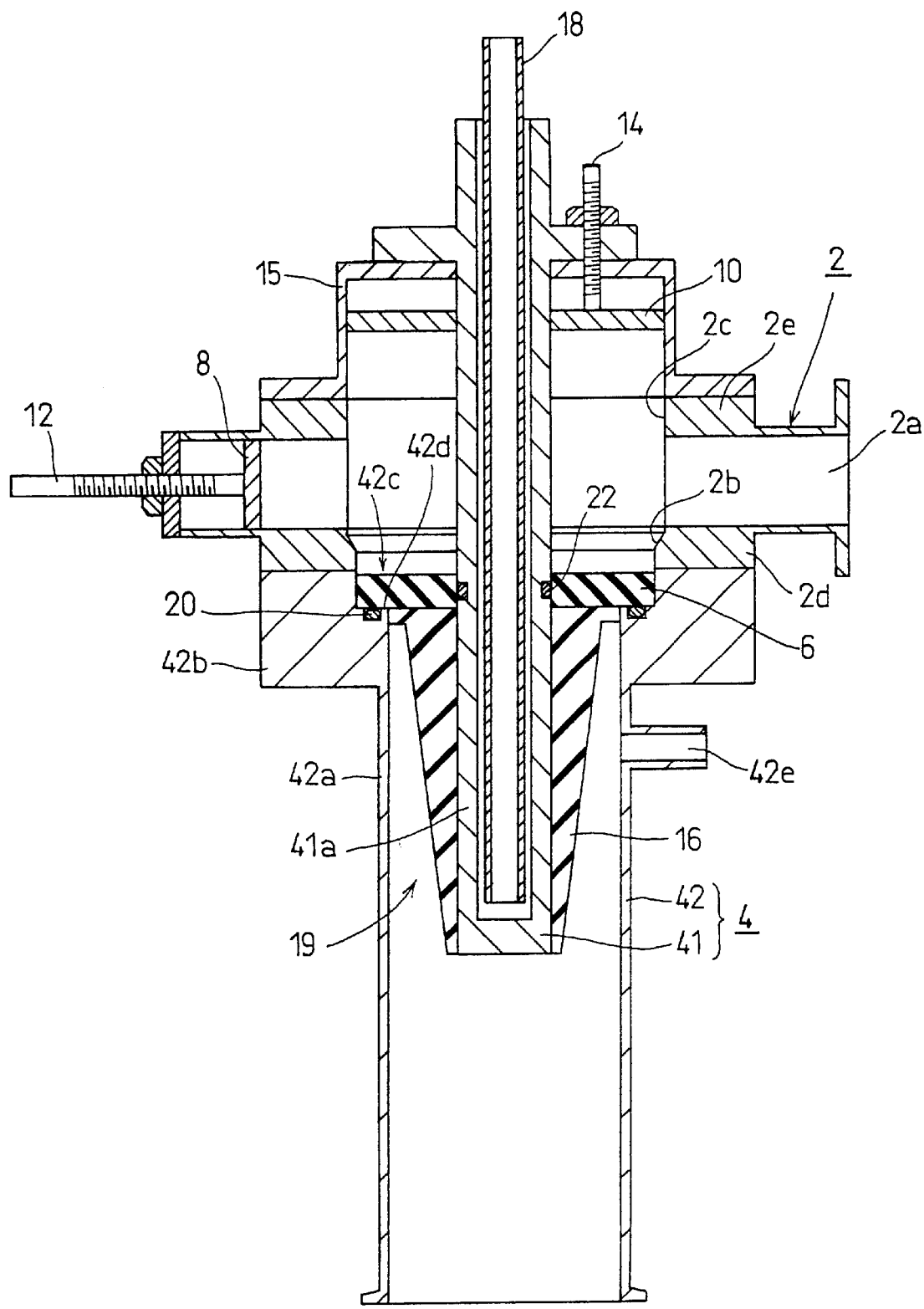
FIG. 3 is a vertical sectional side view of the plasma generator according to the first embodiment of the invention.
Figure 4:
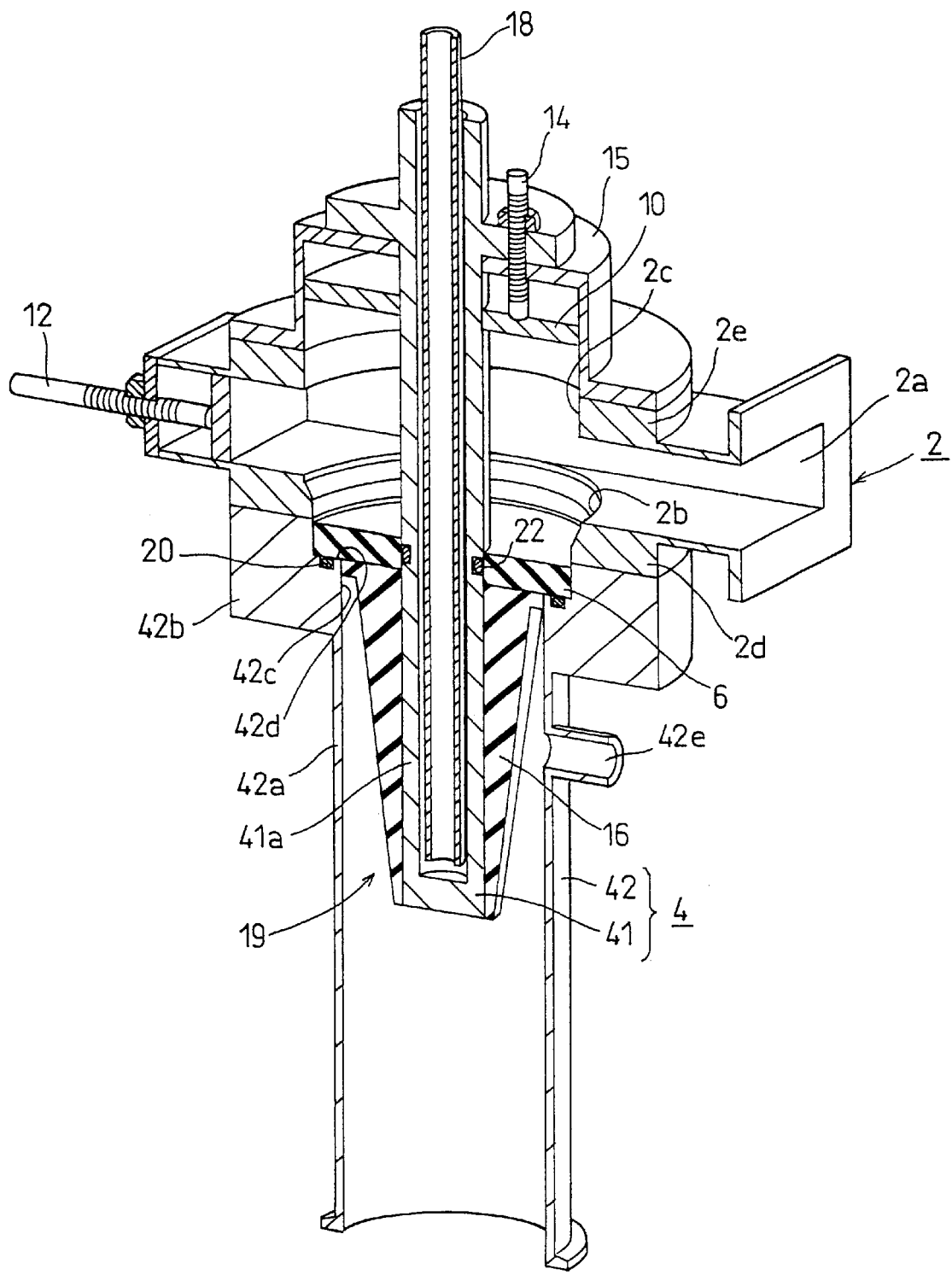
FIG. 4 is a semi-sectional perspective view of the first embodiment of the invention.
Figure 5:
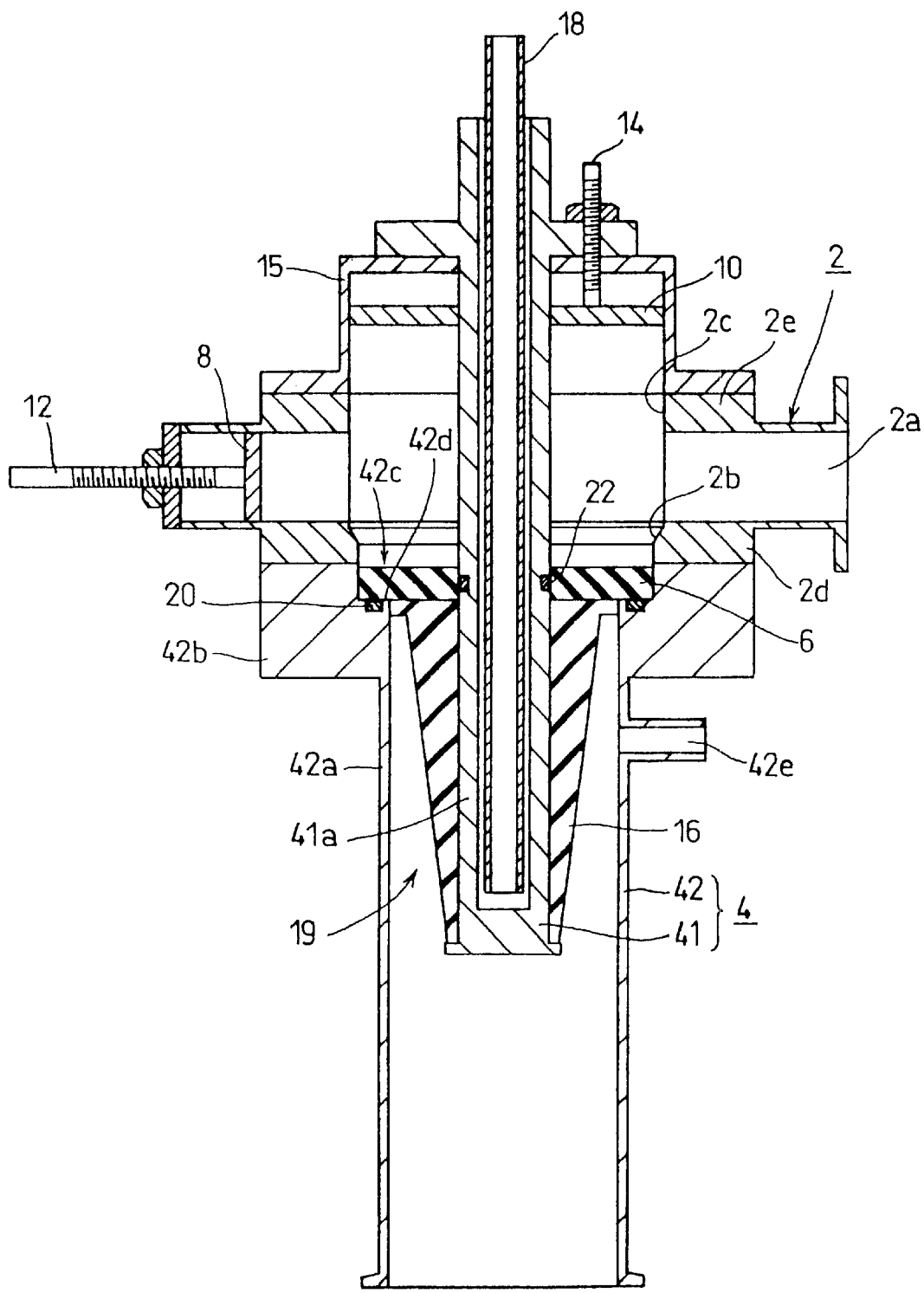
FIG. 5 is an illustration for showing an exemplified shape of the inner conductor for preventing an insulator from dropping from the plasma generator according to the first embodiment of the invention.
Figure 6:
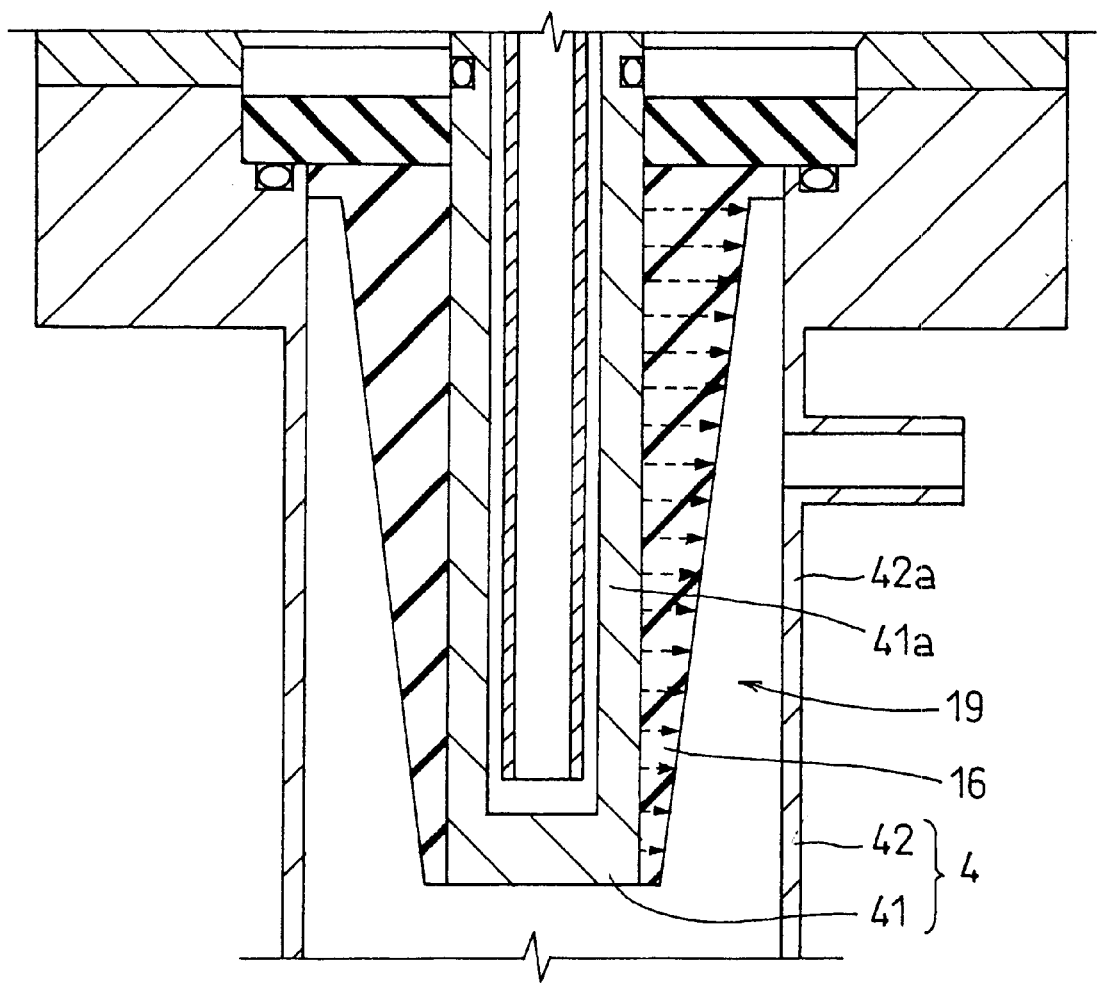
FIG. 6 is an enlarged view of an important portion of the plasma generator according to the first embodiment of the invention.
Figure 7:
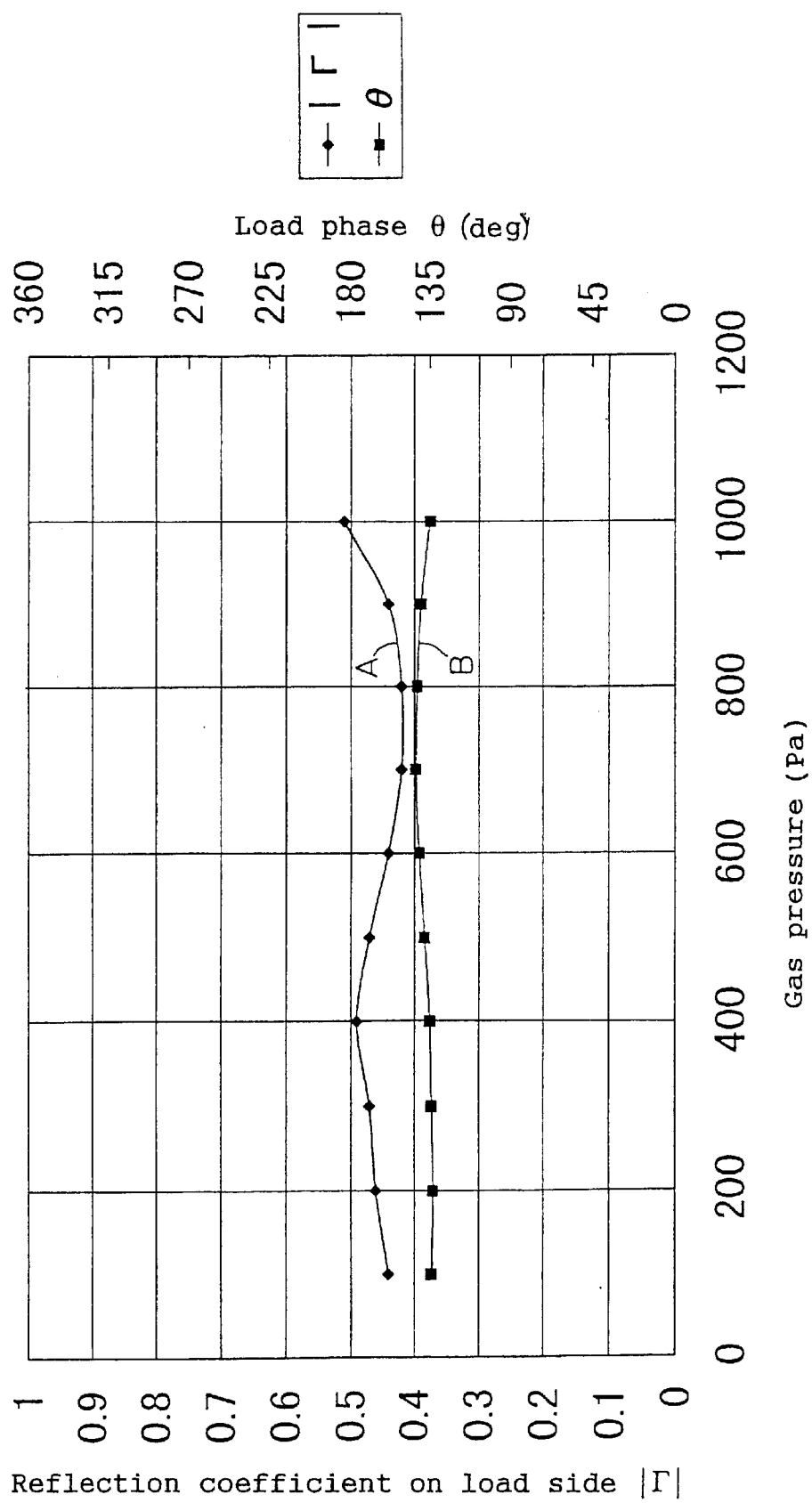
FIG. 7 is a graph for explaining an action of the plasma generator according to the first embodiment of the invention.

FIGS. 3 through 8 relate to a first preferred embodiment of the invention, of which FIG. 3 is a vertical sectional side view of the entire plasma generator according to this embodiment, FIG. 4 is a semi-sectional perspective view of the plasma generator of FIG. 3, FIG. 5 shows an exemplified shape of the inner conductor, FIG. 6 is an enlarged view of the important portion of FIG. 3, FIG. 7 is a graph for explaining an action of this embodiment, and FIG. 8 shows another exemplified shape of the insulator.

In this embodiment shown, a reference numeral 2 indicates a rectangular waveguide, a numeral 4 indicates a coaxial tube, a numeral 6 indicates a vacuum-sealing window, numerals 8 and 10 indicate movable terminals, numerals 12 and 14 indicate manipulators, a numeral 15 indicates a movable terminal mounting cylinder, a numeral 16 indicates a conical insulator, and a numeral 18 indicates a cylinder for introducing a cooling medium. The cooling medium may be, for example, cooling water as well as any other appropriate substances.

The rectangular waveguide 2 has such a rectangular cross section that has its one end opened in its tube-axial direction and the other tube-directional end blocked, at an opening 2a in that one end is mounted a microwave power source for applying therefrom a microwave power to the interior.

The rectangular waveguide 2 comprises also mounting bosses 2d and 2e having circular openings 2b and 2c at the lower and upper sides of the tube somewhere along its tube axis, respectively, in such a configuration that the mounting boss 2d has attached thereto an outer conductor 42 of the coaxial tube 4 described later and the other mounting boss 2e has attached thereto the movable terminal mounting cylinder 15.

The movable terminal mounting cylinder 15, made of a conductor, has such a configuration that the movable terminal 10 is mounted so as to be displaced along its cylinder axis. The movable terminal 10 is mounted at one end of the manipulator 14 in such a manner that it may be displaced in the cylinder axial direction when the manipulator 14 is turned, in order to enhance the microwave field in a plasma generating space 19 described later.

The coaxial tube 4 has an inner conductor 41 and a outer conductor 42 radially arranged external of the inner conductor 41, both of which are made of a conductor such as metal, thus together forming a partial double-tube construction at a predetermined portion below the vacuum sealing window 6. The inner conductor 41 has a barrel shaped construction with one end opened and the other end blocked in such a configuration that a predetermined portion 41a (one plasma electrode) at the one end radially faces another predetermined portion 42a (another plasma electrode) at one end of the outer conductor 42, in order to form the plasma generating space 19 at a gap between these two plasma electrodes facing each other.

The other end of the inner conductor 41 penetrates through the rectangular waveguide 2 along the tube axis of the coaxial tube 4 to thereby upward protrude at an end, which is electrically and mechanically connected to the external surface of the movable terminal mounting cylinder 15 to be grounded. By this construction, the other end of the inner conductor 41 is thermally coupled to the rectangular waveguide 2.

The inner conductor 41 has the cylinder 18 inserted therein through the opening in the other end for introducing a cooling medium. By this construction, the cooling medium supplied inside the cylinder 18 through its one end goes out through its other end and then is returned to the outside through a gap between the outer periphery of the cylinder 18 and the inner conductor 41.

The outer conductor 42 has a larger-diameter portion 42b at its one end, at which is formed a circular recess 42d which is provided for mounting the vacuum sealing window 6 and also which has an opening 42c at its center.

The vacuum sealing window 6 comprises a heat resistant insulator made of a substance which is chemically stable and also which hardly absorb a microwave preferably such as Teflon, alumina, quartz, and the like, which insulator is mounted in the circular recess 42d of the outer conductor 42, thus blocking the gap between the opening 2b in the rectangular waveguide 2 and the coaxial tube 4. In the plasma generator shown in the figure, the vacuum sealing window 6 blocks the gap between the inner conductor 41 and the larger-diameter portion 42b of the outer conductor 42 communicatively connected to the opening 2b in the rectangular waveguide 2, thus blocking also the gap between the opening 2b in the rectangular waveguide 2 and the coaxial tube 4. Between the vacuum sealing window 6 and the inner conductor 41 and between the opening 42c in the outer conductor 42 and the vacuum sealing window 6 are respectively interposed O rings 22 and 20 made of rubber or any other elastic substances, which these O rings 20 and 22 cooperate with the vacuum sealing window 6 to vacuum block the interior (plasma generating space 19) of the coaxial tube 4 against the rectangular waveguide 2. Here, the vacuum sealing window 6 and the O rings 20 and 22 together form the sealing means.

Note here that the outer conductor 42 is provided with a gas inlet 42e for introducing plasma in its plasma electrode 42a.

The coaxial tube 4 has its above-mentioned double-tube construction portion connected in a T shape to the rectangular waveguide via the respective openings 2b and 42c against the rectangular waveguide 2. Although the other end of the inner conductor 41 penetrates through the rectangular waveguide 2 along the tube axis of the coaxial tube 4 to thereby protrude upward, this geometry is to be included in the T shape as referred to in the present specification of the invention.

The movable terminals 8 and 10 can be moved by the respective manipulators 12 and 14 so as to enhance the microwave field in the plasma generating space 19. By optimizing the geometry of the rectangular waveguide 2 and the movable terminal mounting cylinder 15, however, the movable terminals 8 and 10 and the respective manipulators 12 and 14 can be omitted.

The insulator 16 for preventing a contamination (metal reaction product) from being diffused from the inner conductor 41 into plasma is annualy provided on the outer periphery of the plasma electrode 41a of the inner conductor 41 as linked to the vacuum sealing window 6, thus having a conical-shaped outer-diameter surface, the diameter of which shrinks uniformly in a direction opposite to the vacuum sealing window 6. This insulator 16 is made of an insulating material such as ceramic, quartz, sapphire, alumina, aluminum nitride, etc., which is chemically stable and excellent in heat resistance and corrosion resistance.

By providing a stepped geometry of the lower portion of the inner conductor 41 in order to prevent the insulator 16 from falling as shown in FIG. 5, the insulator 16 need not be fixed to the inner conductor 41 with a screw and the like, thus preferably simplifying the structure.

The following will describe the actions and effects of the embodiment having the above-mentioned construction.

(1) Since plasma is generated in the plasma generating space 19 formed by the space radially facing the respective one-end side plasma electrodes 41a and 42a of the inner conductor 41 and the outer conductor 42 of the coaxial tube 4, the heat due to thus generated plasma heats the inner conductor 41 up to a high temperature. In this case, since the other end of the inner conductor 41 is thermally coupled to the rectangular waveguide 2, the plasma generative heat is transferred from one end to the other end of the inner conductor 41 and then radiated to the movable terminal mounting cylinder 15 and the rectangular waveguide 2 to resultantly radiate heat from the coaxial tube 4, so that this plasma generative heat may not be accumulated in the apparatus (especially in the inner conductor 41), thus avoiding damages to the apparatus. Accordingly, the microwave power need not be limited in supply quantity in fear of such thermal damages, so that a high microwave power can be supplied to the plasma generator, thus enhancing the power of the plasma generator that much.

(2) It is even more preferable in that through the opening in the other end of the inner conductor 41 of the coaxial tube 4, a cooling medium can be supplied from the cylinder 18 to cool the inner conductor 41 and the O ring 22. In particular, the cylinder 18 can be provided to form a cooling medium distribution path from the interior of the cylinder 18 through the gap between that cylinder 18 and the inner conductor 41 in order to efficiently distribute the cooling medium along this distribution path, thus further improving the cooling efficiency.

(3) The inner conductor 41, which constitutes a partition between the cooling medium and the plasma generating space 19, is made of metal or any other appropriate conductor not easily damaged, and so it is not damaged by an effect of a difference in pressure between the pressure of the plasma generating space 19 (vacuum) and the internal pressure 41 (atmospheric pressure) nor by an effect of the hot plasma. Therefore, the cooling medium does not leak to the plasma generating space 19 because its distribution path is not damaged, to enable cooling the interior of the apparatus without fear of damaging the apparatus, thus improving the reliability.

(4) Since the surrounding of the inner conductor 41 is covered by the insulator 16, the inner conductor 41 is not directly exposed to plasma, thus making it possible to prevent a contamination (metal particulate) from being diffused into the plasma.

Also, the insulator 16 is provided to enhance the durability of the inner conductor 41.

Further, a cooling medium distributed through the cooling medium distribution path provided in the inner conductor 41 cools the insulator 16. Accordingly, it is possible to prevent the insulator 16 from being cracked or otherwise damaged by its thermal stress, thus improving the durability of the insulator 16.

(5) Since the inner conductor 41 of the coaxial tube 4 has its other end connected electrically to the movable terminal mounting cylinder 15 and the rectangular waveguide 2, the microwave can be preferably prevented from leaking to the outside.

(6) At the prior art boundary between plasma and a microwave, the microwave field runs parallel with the plasma, so that the power of a reflected wave of the microwave is very high.

By the invention, the boundary between plasma and a microwave is provided with the insulator 16 so that the microwave field may not run parallel with the plasma. Accordingly, the microwave can be more easily absorbed by the plasma, thus reducing the reflected wave power. Further, by adjusting the geometry of the insulator 16, it is possible to maintain the impedance of the total load at a roughly constant value against large fluctuations in plasma impedance caused by transitional ignition of the plasma, changes in the processes, etc. Accordingly, it is unnecessary to suppress the reflected wave power of a microwave using the matching action of a matching device, which has been required conventionally, thus making more easy and efficient a variety of tasks with plasma. In addition, the apparatus can be handled more easily and reduced in cost since a large and heavy matching device is not employed. The electric filed in the insulator 16 is oriented in a radial direction as indicated by a dotted arrow in FIG. 6. Since the microwave is of an alternate current, its field is oriented inward or outward radially depending on time and position.

(7) The actions and effects of the insulator 16, which is conical in shape, are described with reference to FIG. 7.

FIG. 7 shows gas pressure dependency of the magnitude $|\Gamma|$ of the reflection coefficient on the side of the load and the load phase $\theta$. Although the insulator 16 measures 105 mm in tube-axial length in this case, its length is not limited to this value. In FIG. 7, the horizontal axis represents a gas pressure (Pa), the left side vertical axis represents the magnitude $|\Gamma|$ of the reflection coefficient on the load side, and the right side vertical axis represents the load phase $\theta$. The characteristic curve A represents the magnitude of the coefficient $|\Gamma|$ and the characteristic curve B, the load phase $\theta$. FIG. 7 shows a case where the magnitude changes with the changing pressure of a gas supplied to the plasma generating space 19 from the outer conductor 42 through the gas inlet 42e.

The magnitude of coefficient on the load side $|\Gamma|$ represents in ratio the coefficient of a voltage of the reflected wave with respect to a voltage of the traveling wave and the load phase $\theta$, a phase of the voltage of the reflected wave with respect to the voltage of the traveling wave. The reflection coefficient being "1" means that the power is all reflected, so that the smaller the characteristic curve A of the reflection coefficient, the better will it be.

Since the type and the pressure of a gas introduced through the above-mentioned gas inlet 42e depend on the processes for manufacturing semiconductor devices, it is necessary to optimize the conditions for each of the processes. In this embodiment, the outer-diameter surface of the insulator 16 is conical, even with the changing gas pressure, changes in the above-mentioned magnitude of the reflection coefficient $|\Gamma|$ and the load phase $\theta$ can be reduced small and to a roughly constant value, thus preferably making this optical setting accurate and easy.

Accordingly, in the above-mentioned embodiment, the outer-diameter surface of the insulator 16 would shrink as it goes in a direction opposite to the side of the vacuum sealing window 6, so that even with the pressure of a gas supplied to the plasma generating space 19 changing with the semiconductor manufacturing process, the conditions for the process can be optimized accurately and easily.

The invention is not limited to the above-mentioned embodiment but various modifications and variants thereto may be possible.

(1) Although the above-mentioned embodiment has employed a conical shape of the outer-diameter surface of the insulator 16, it need not be conical but may be of any other appropriate shapes, such as a straight shape, that the same diameter continues in the tube-axial direction as mentioned above, a curved shape, etc. Also, the surrounding may be provided with a groove to prevent cracking due to thermal stress.

The following will describe one example of other shapes with reference to FIG. 8, which shows an example of another shape of the insulator 16.

Figure 8A:
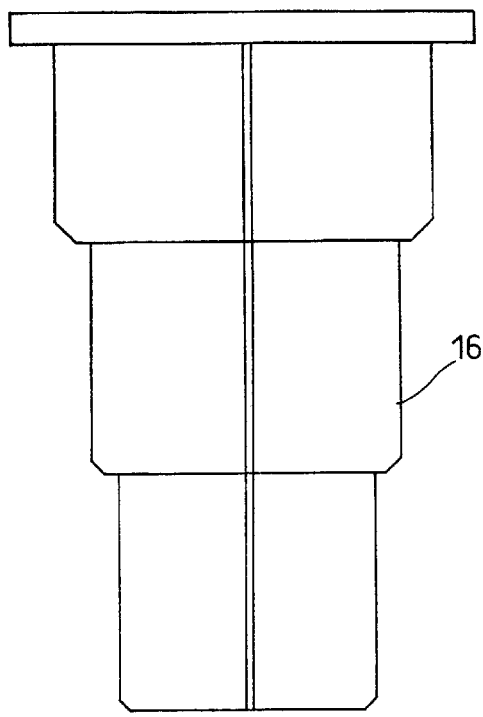
FIG. 8A is an illustration for showing another exemplified shape of the insulator of the plasma generator according to the first embodiment of the invention.
Figure 8B:
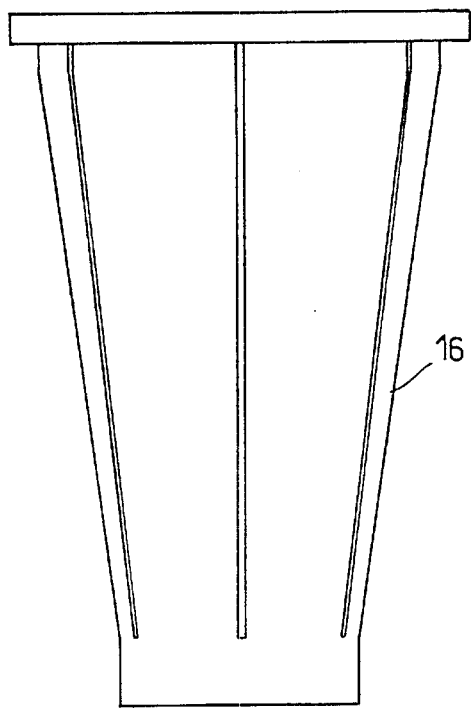
FIG. 8B is an illustration for showing still another exemplified shape of the insulator of the plasma generator according to the first embodiment of the invention.
Figure 8C:
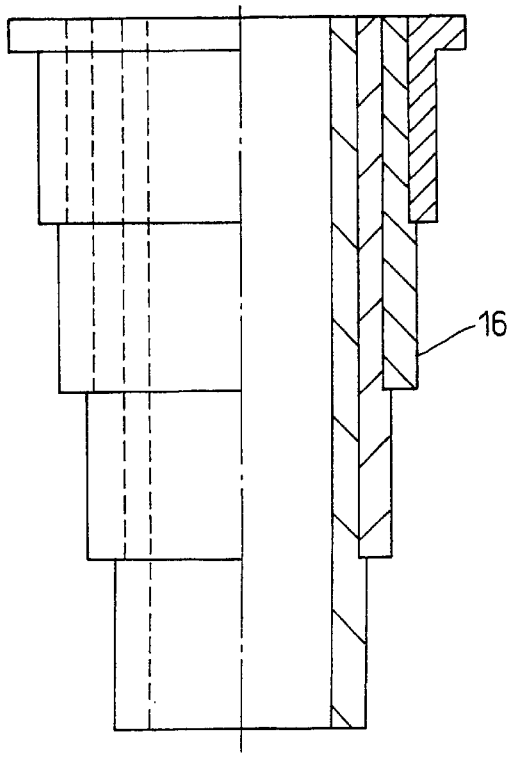
FIG. 8C is an illustration for showing still another exemplified shape of the insulator of the plasma generator according to the first embodiment of the invention.

FIG. 8A shows an example where the outer-diameter shape decreases in area step-wise and a groove is formed in the surrounding. In this case, the groove may be omitted. FIG. 8B shows an example where a groove is formed in the surrounding. FIG. 8C shows an example where annular insulators with different lengths are combined and each provided partially with a step for preventing falling.

(2) If, to facilitate maintenance of the plasma generator in the above-mentioned embodiment, for example, the other components, i.e. the inner conductor 41 of the coaxial tube 4, the cylinder 18 for introduction of a cooling medium, the vacuum sealing window 6, the insulator 16, the movable terminal 10, the manipulator 14, and the movable terminal mounting cylinder 15 are integrated as one unit and mounted to the outer conductor 42 of the coaxial tube 4 detachably, the insulator 16 can be easily maintained and replaced. Also, the O rings 20 and 22 made of such an elastic substance as rubber are required to provide a sufficient level of sealing of the interior of the coaxial tube 4 for the above-mentioned purpose of integration into one unit.

(3) The insulator 16 provided in the above-mentioned embodiment which covers the outer periphery of the inner conductor 41 has been done so in order to prevent the inner conductor 41 from being directly exposed to hot plasma so that a contamination (metal particulate) may not be diffused from the inner conductor 41 into plasma. Also, the insulator 16 covering the outer periphery of the inner conductor 41 has a function of suppressing changes in the magnitude of the above-mentioned reflection coefficient $|\Gamma|$ and the load phase $\theta$ over a wide range of the pressure of a gas supplied from the outer conductor 42 through its gas inlet 42e to the plasma generating space 19 even with a change in that pressure.

Figure 9:
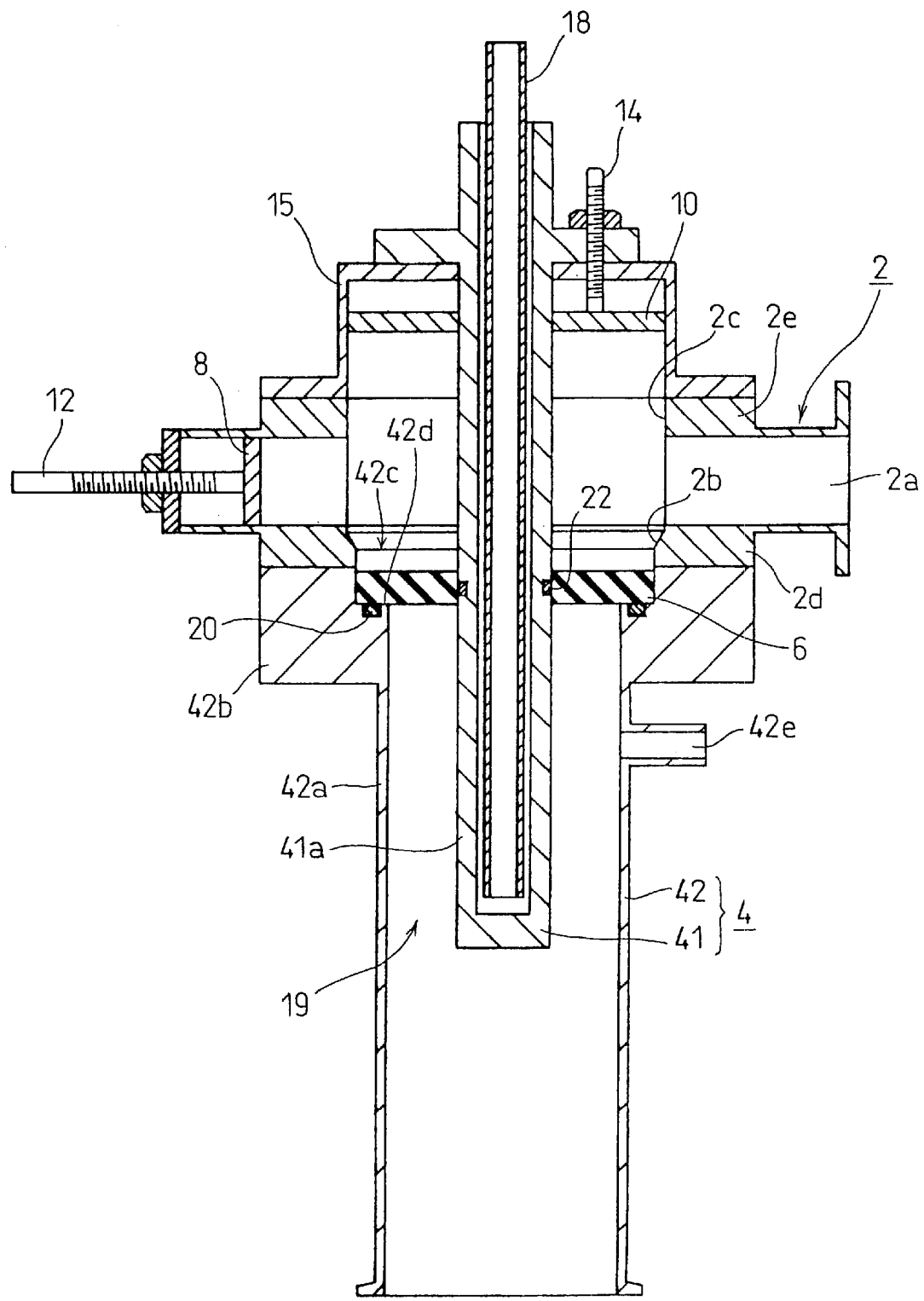
FIG. 9 is a vertical sectional side view for showing the plasma generator according to a variant of the invention.
Figure 10:
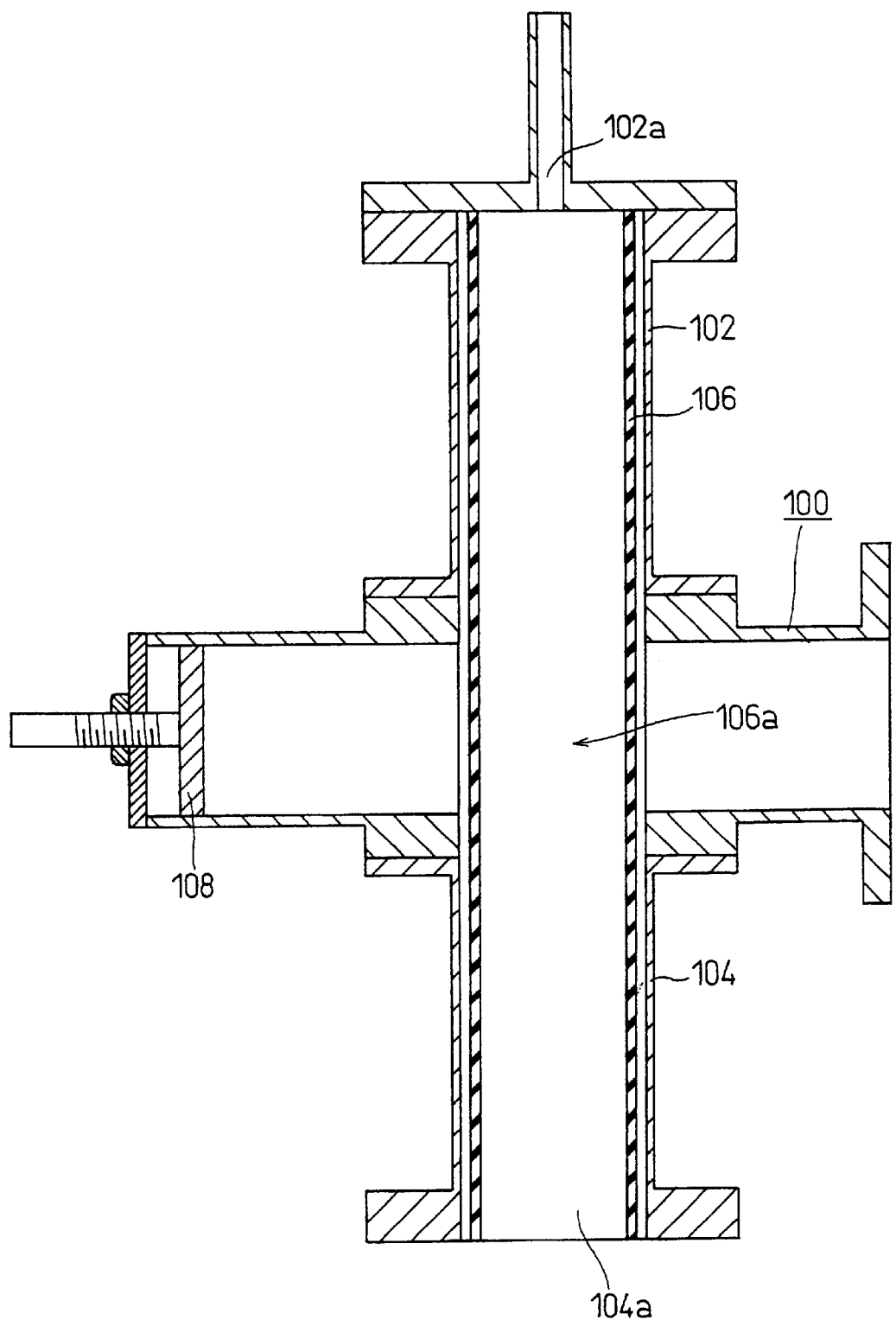
FIG. 10 is a vertical sectional side view for showing a prior art plasma generator.

Accordingly, the insulator 16 may be omitted as shown in FIG. 9 if diffusion of a contamination (metal particulate) from the inner conductor 41 into plasma is negligibly low or if changes in the above-mentioned magnitude of the reflection coefficient $|\Gamma|$ and the load phase $\theta$ are small even without the insulator 16.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A plasma generator for generating plasma using microwave discharge, comprising:

a rectangular waveguide into which a microwave is introduced;

a coaxial tube connected in a T shape to said rectangular waveguide through respective openings;

a vacuum sealing window for blocking said openings with a first insulator to thereby vacuum seal an interior of said coaxial tube against said rectangular waveguide; and a second insulator disposed in said coaxial tube and linked to said vacuum sealing window.

2. The plasma generator according to claim 1, wherein;

said coaxial tube has a double-tube construction that an inner conductor and an outer conductor are arranged in such a construction that said outer conductor is radially disposed externally of said inner conductor with a predetermined gap therebetween; and said second insulator has such an annular construction that said insulator is mounted on an outer periphery of said inner conductor.

3. The plasma generator according to claim 1 or 2, wherein an outer-diameter surface of said first insulator has a shape that an area thereof shrinks in an direction opposite to a side of said vacuum sealing window.

4. A plasma generator comprising:

a rectangular waveguide into which a microwave is introduced;

a coaxial tube communicatively connected in a T shape to an opening in said rectangular waveguide; and sealing means, wherein:

said coaxial tube includes an inner conductor which penetrates through said rectangular waveguide from said opening in a tube-axial direction of said coaxial tube and also which has one end protruding from said rectangular waveguide and an outer conductor disposed externally of said inner conductor at one end thereof and roughly coaxial with said inner conductor;

said sealing means blocks with an insulator a gap between said rectangular waveguide at said opening and said coaxial tube and also vacuum seals a plasma generating space formed between said outer conductor and said inner conductor against said rectangular waveguide; and the other end of said inner conductor is coupled to said rectangular waveguide thermally and electrically.

5. The plasma generator according to claim 4, wherein said inner conductor is comprised of a barrel has one end thereof blocked and which has a cooling medium distribution path formed an inner space thereof.

6. The plasma generator according to claim 5, wherein in said inner conductor, a barrel for supplying a cooling medium is housed and arranged, from an interior of which barrel is formed a cooling medium distribution path over a gap between said barrel and said inner conductor.

7. The plasma generator according to any one of claims 4 through 6, further comprising an insulator for covering an outside of one end side of said inner conductor.

8. The plasma generator according to claim 5 or 6, further comprising an insulator for covering an outside of one end side of said inner conductor, wherein said insulator is cooled by a cooling medium distributed through said cooling medium distribution path.

* * * * *